(12) United States Patent
Mehlhorn et al.

(10) Patent No.: US 6,324,328 B1
(45) Date of Patent: Nov. 27, 2001

(54) CIRCUIT CARRIER WITH INTEGRATED, ACTIVE, OPTICAL FUNCTIONS

(75) Inventors: Torsten Mehlhorn, Berlin; Peter Birkholtz; Walter Pröbster, both of München, all of (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/334,227

(22) Filed: Jun. 16, 1999

(30) Foreign Application Priority Data

Jun. 16, 1998 (DE) ............................................... 198 26 658

(51) Int. Cl.$^7$ ....................................................... G02B 6/10
(52) U.S. Cl. .............................. 385/131; 385/14; 385/129; 385/130
(58) Field of Search ........................... 385/14, 15, 129, 385/130, 131, 141, 132

(56) References Cited

U.S. PATENT DOCUMENTS

| | | | |
|---|---|---|---|
| 5,396,363 | * | 3/1995 | Valette .............................. 385/131 X |
| 5,572,619 | * | 11/1996 | Maruo et al. ......................... 385/143 |
| 5,598,501 | * | 1/1997 | Maruo et al. ......................... 385/143 |
| 5,887,116 | * | 3/1999 | Grote ..................................... 385/2 |
| 5,892,859 | * | 4/1999 | Grote ..................................... 385/2 |
| 6,140,009 | * | 10/2000 | Wolk et al. ........................... 430/200 |

\* cited by examiner

*Primary Examiner*—Brian Healy
(74) *Attorney, Agent, or Firm*—Herbert L. Laurence; Werner H. Greenberg

(57) ABSTRACT

A circuit carrier includes several layers of at least one insulating material and conductor structures located on or in the layers. At least one optical layer is embedded on both sides in other layers.

19 Claims, 7 Drawing Sheets

CIRCUIT CARRIER WITH INTEGRATED, ACTIVE, OPTICAL FUNCTIONS

BACKGROUND OF THE INVENTION

Field of the Invention

The invention relates to a circuit carrier including several layers of at least one insulating material and conductor structures located on or in the layers.

Such circuit carriers are known and are generally constructed as circuit boards which simultaneously act as mechanical carriers of components that are fixed to the circuit board through diverse soldering processes and are connected electrically with the conductor structures. Mostly multilevel circuit boards are used which have conductor structures at least on both of their outer surfaces and often on their inner surfaces as well and feedthroughs are frequent. Depending on the requirements set by climatic conditions, component density, etc., such circuit carriers are made from epoxy-resin glass fabrics or from other synthetic materials such as polyester, polyamide or polytetrafluoroethylene. Equipping the circuit boards, usually with so-called SMD components, is mostly performed with full automation.

In view of the advantages of optical methods of transmitting information there is an increasing trend toward the use of optoelectronic components which emit and/or receive light. Flexible optical fibers are also used for connecting such optoelectronic components on circuit boards. Although a diversity of connection and plug-in techniques have been developed for connecting the optical fibers with the optoelectronic components, it is clear that none of those techniques is really suitable for automated equipping of the circuit board, in which the optical connections function outside the actual circuit board or circuit carrier.

SUMMARY OF THE INVENTION

It is accordingly an object of the invention to provide a circuit carrier with integrated, active, optical functions, which overcomes the hereinafore-mentioned disadvantages of the heretofore-known devices of this general type and which provides a fundamental improvement that represents progress with respect to both mechanical strength and a possibility of automated assembly.

With the foregoing and other objects in view there is provided, in accordance with the invention, in a circuit carrier, comprising several layers of at least one insulating material and conductor structures located on or in the layers, at least one optical layer having two sides; and other layers in which both of the sides of the at least one optical layer are embedded.

As a result of the invention, the assembly of printed circuits with optoelectronic components is considerably simplified and in addition the range of application for optoelectronic systems is expanded. It is possible to dispense with complicated connections over optical fibers on the surface of the circuit board, which connections have to be made after the automated assembly.

In accordance with another feature of the invention, it is advantageous if the optical layer is adjoined on at least one side by an electrically conducting layer, especially if the electrically conducting layer is formed of an electrically conductive polymer and if the optical layer is an optically active, electrically excitable layer. In this way it is also possible to generate optical signals within the circuit carrier through excitation of the optical layer. The electrical excitation can also be used advantageously in this way, for example to actuate an optical switch, to connect optical signals between several optical layers disposed in the conductor structure if these optical layers are connected with each other, or to control a splitter which distributes the optical signals between several optical layers.

In accordance with a further feature of the invention, in order to achieve a good packing density, at least one side of the optical layer is adjoined by a circuit board layer with conductor structures.

In accordance with an added feature of the invention, the circuit board layer has a metal carrier coated by a layer of plastic. This improves both strength and thermal conductivity characteristics.

In accordance with an additional feature of the invention, there is provided a thin layer of a thermally conducting prepreg disposed between the optical layer and an adjoining layer in order to improve stability and thermal conductivity. For example, this prepreg may be placed between the layers as a film before the structure is laminated and then remains in the finished circuit carrier as just a very thin, but thermally conducting layer.

In accordance with yet another feature of the invention, the optical layer is provided with perpendicular feedthroughs which connect conductor structures on both sides of the optical layer. Such feedthroughs can thus also be used in a circuit carrier in accordance with the invention and do not interfere as long as the optical layer has a sufficient width.

In accordance with yet a further feature of the invention, the optical layer is a polyimide layer. This material has both electrical and mechanical properties which are favorable for the purpose at hand.

In accordance with yet an added feature of the invention, for the purpose of light transmission within the circuit carrier, the optical layer is constructed as a multimode waveguide, since it is less critical with regard to coupling and decoupling the optical signals due to its generally larger diameter.

In accordance with yet an additional feature of the invention, at least one side is constructed for surface mounting of SMD components.

In accordance with again another feature of the invention, there are provided optoelectronic components mounted on at least one side/surface, and an optical or fiber-optic waveguide leading from the optoelectronic components to the at least one optical layer.

In accordance with again a further feature of the invention, since the intention is to reach into the optical layer from the optoelectronic component by the shortest path, it is useful to make the optical connection between the optical waveguide and the optical layer through the use of a ground angle, preferably of less than 90°. In the same way the deflection can be realized through a prism or a partly transparent beam splitter.

In accordance with again an added feature of the invention, with regard to the laminating techniques being used, it is also recommended that the optical layer be constructed as a film or contained in a film.

In accordance with again an additional feature of the invention, the optical layer is produced by hot stamping or by visible optical patterning.

In accordance with a concomitant feature of the invention, there is provided at least one plug-in connection with electrical and optical contacts so that an electro-optical hybrid plug-in connection is provided with suitable mating contacts. The circuit carriers in accordance with the invention can therefore be used in the same way as known circuit carriers.

Other features which are considered as characteristic for the invention are set forth in the appended claims.

Although the invention is illustrated and described herein as embodied in a circuit carrier with integrated, active, optical functions, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
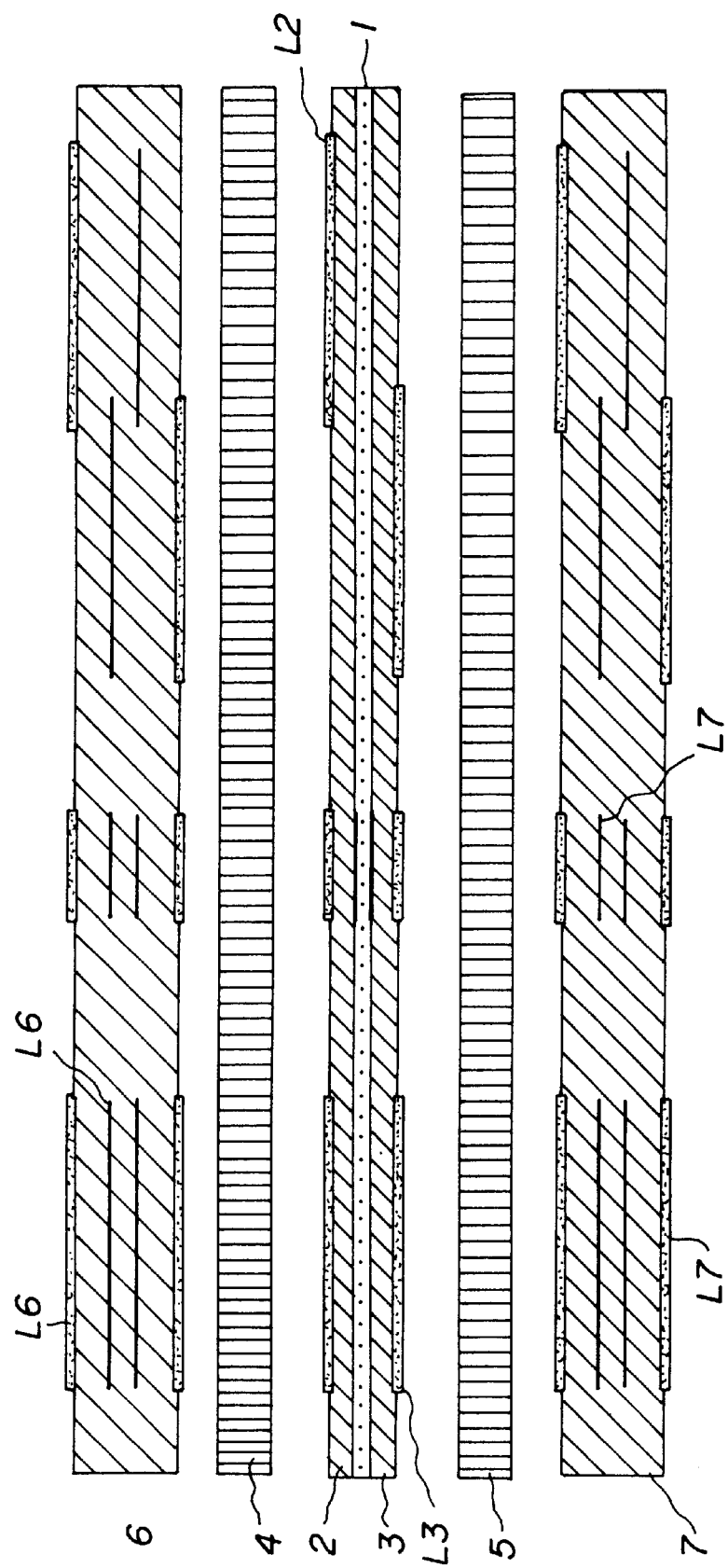
FIG. 1 is a diagrammatic, exploded, elevational view of a first embodiment example of a circuit carrier in accordance with the invention, before final assembly.

Referring now to the figures of the drawings in detail and first, particularly, to FIG. 1 thereof, there are seen layers which are prepared or prefabricated for final fabrication of a circuit carrier in accordance with the invention. The layers are namely an optical layer 1 which can, for example, be an optically active polyimide layer and which is embedded on both sides in circuit board layers 2 (located above in the drawing) and 3 (located below in the drawing). The two circuit board layers 2, 3 are provided with respective conductor structures L2 and L3.

FIG. 1 also shows layers 4, 5 of a thermally conducting prepreg, e.g. a soft, sticky polymer mat, respectively located above and below the combined layer described above. Circuit board layers 6, 7 are respectively shown in FIG. 1 at the very top and very bottom. Conductor structures L6 and L7 are respectively located on and in these layers 6, 7.

Circuit board layers 2, 3, 6 and 7 are made of plastics, e.g. THERMAGON in the prior art and the conductor structures are formed of metal, generally of copper. If the optical layer 1 is optically active, it is possible to use mutually opposite conducting paths adjoining the layer 1 for electro-optical excitation of the layer 1, as is visible in the middle in FIG. 1.

Figure 2:
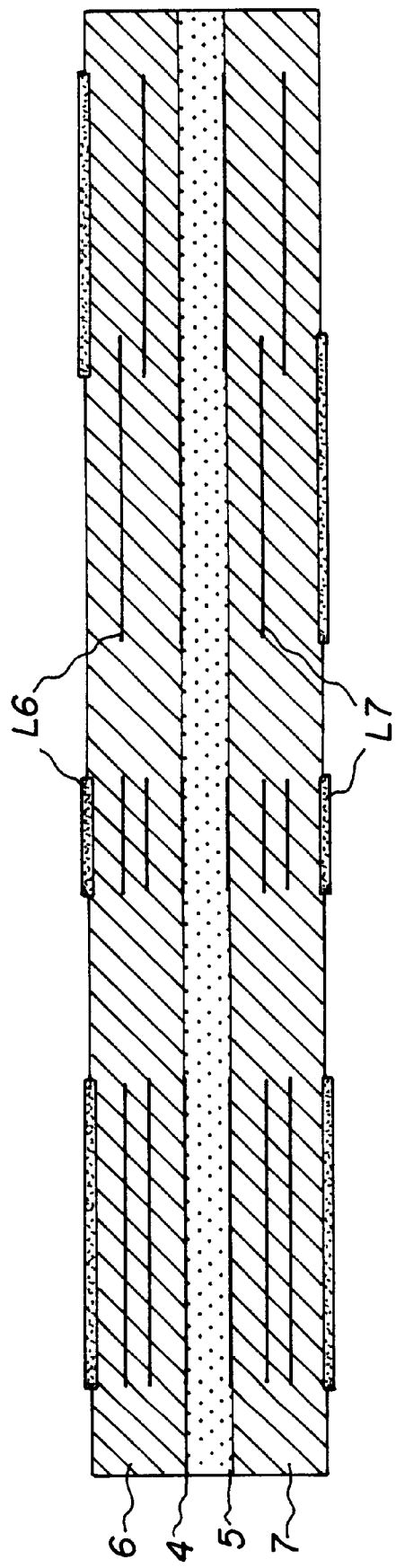
FIG. 2 is an elevational view of a second embodiment example in assembled condition.

In order to provide a final fabrication of a complete circuit carrier, the layers shown in FIG. 1 are laminated together, in which case specific pressures and temperatures are applied as appropriate to the materials being used. The end product is, for example, the circuit carrier in accordance with the invention that is illustrated in FIG. 2, which can be equipped with components in the same way as the circuit boards of the prior art, as will be described in detail below. In contrast to the illustration in accordance with FIG. 1, the circuit board layers 2 and 3 of FIG. 1 are missing. The layers 4 and 5 shown in FIG. 1 are indicated in FIG. 2 solely by their positions since they are very thin after the laminating process. To be precise, the thickness of these layers lies in the micron range.

Figure 3:
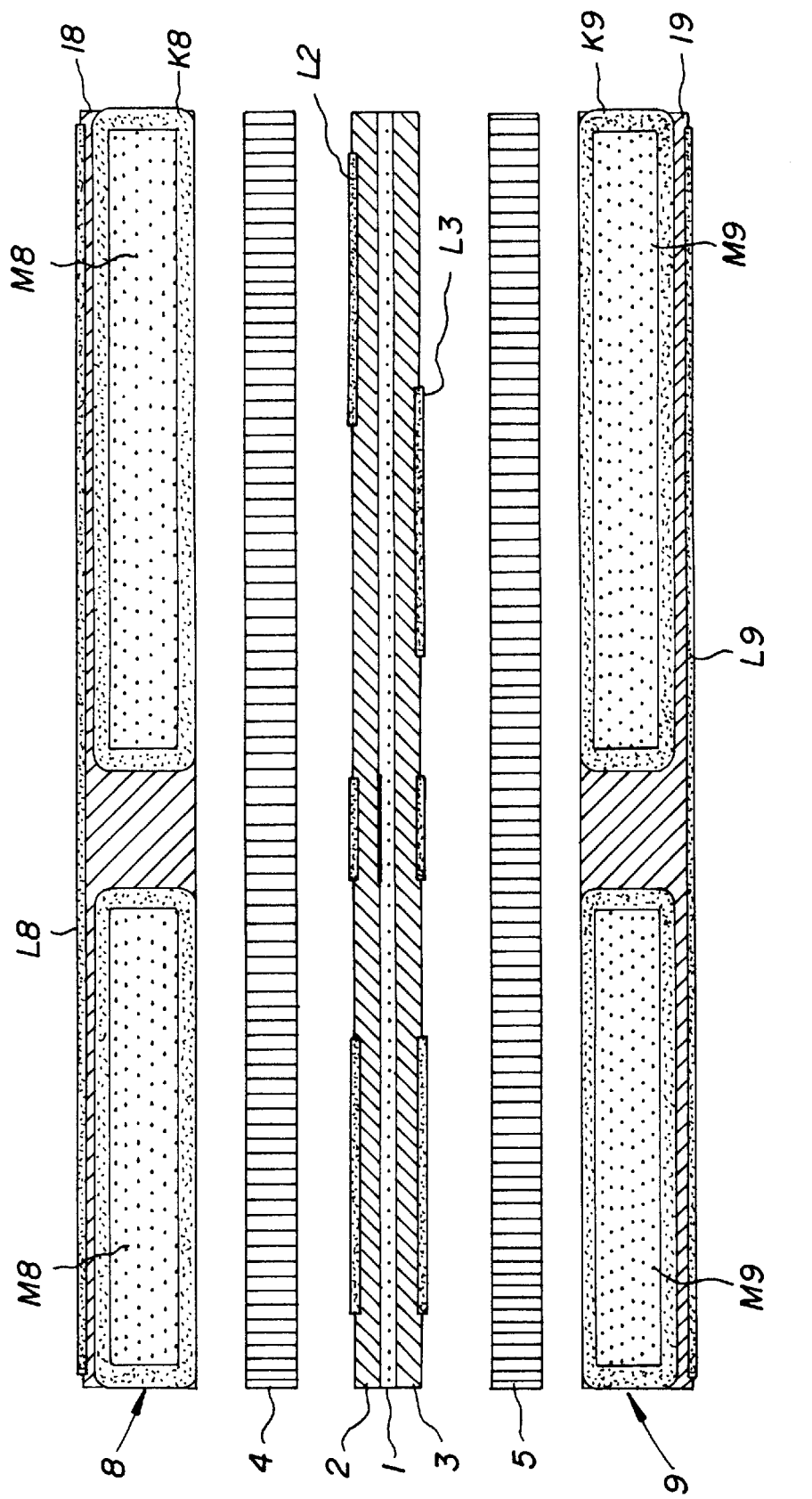
FIGS. 3 and 4 are views corresponding to FIGS. 1 and 2, but showing a third embodiment example of the invention.

In a third embodiment of the invention in accordance with FIG. 3, a layer is provided which is formed of an optical layer 1 and two circuit board layers adjoining the optical layer. As in FIG. 1, two layers 4, 5 of a prepreg are also present.

Circuit board layers 8, 9 which are shown at the very top and very bottom in FIG. 3 each have metal carriers M8, M9 coated with a thermally conducting plastic K8, K9, e.g. a semi-finished product which is known under the brand name THERMAGON. The layers 8, 9 also contain a circuit board insulation I8, I9 and conductor structures L8, L9. However, in this case, they are not yet etched, i.e. not yet actually structured, but are present as a metal layer.

Figure 4:
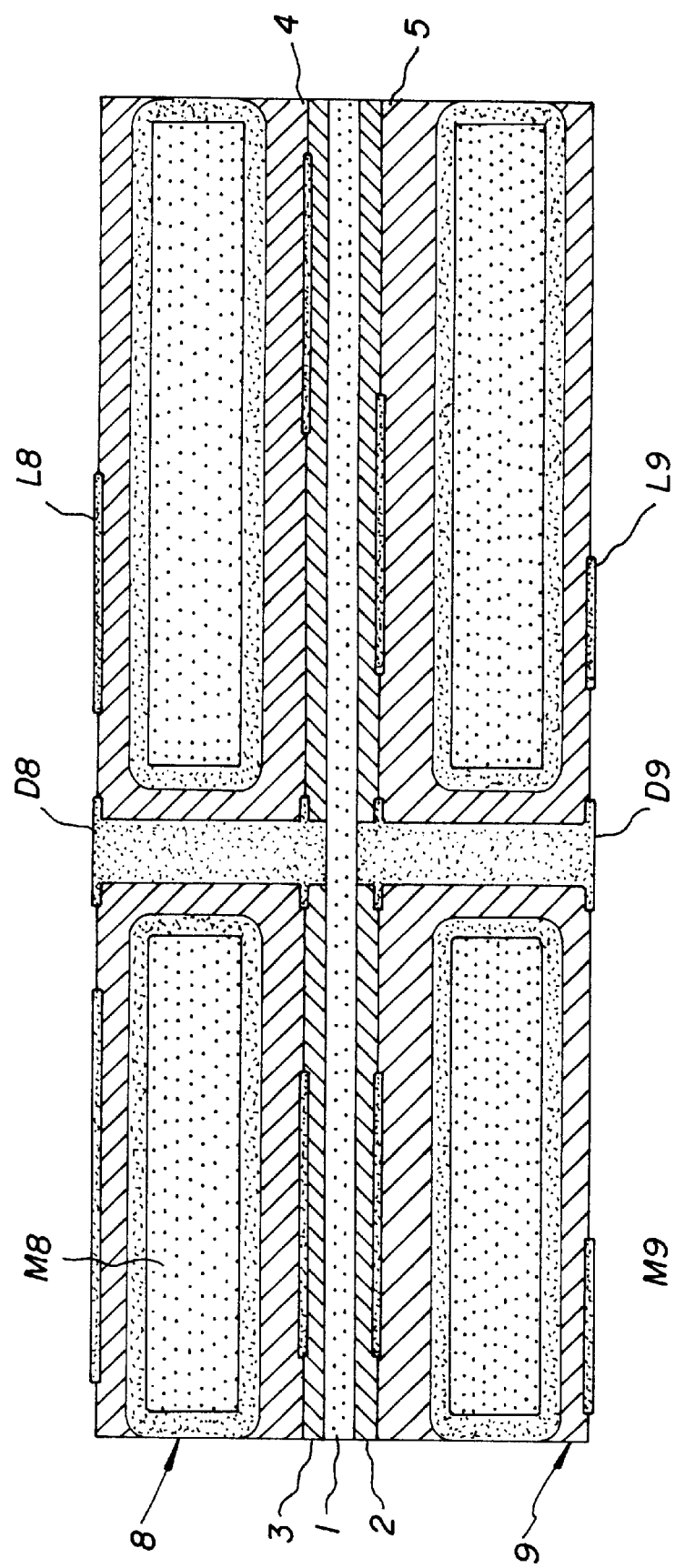

FIG. 4 shows the layers according to FIG. 3 after the layers have been combined through appropriate treatment into a circuit carrier in accordance with the invention. The conductor structures L8, L9 are now also etched in the outermost layers 8, 9. In each of these layers a feedthrough D8, D9 is made which extends to mutually oppositely lying conducting path surfaces adjoining the optical layer 1 and, in the event that the optical layer is optically active, can, for example, excite it to emit light. It is also possible to achieve other electro-optical effects insofar as the material of the optical layer 1 possesses the necessary proper-ties. The layers 4 and 5 illustrated in FIG. 3 are indicated in FIG. 4 solely by their positions since they are very thin after the laminating process. To be precise, the thickness of these layers lies in the micron range.

Figure 5:
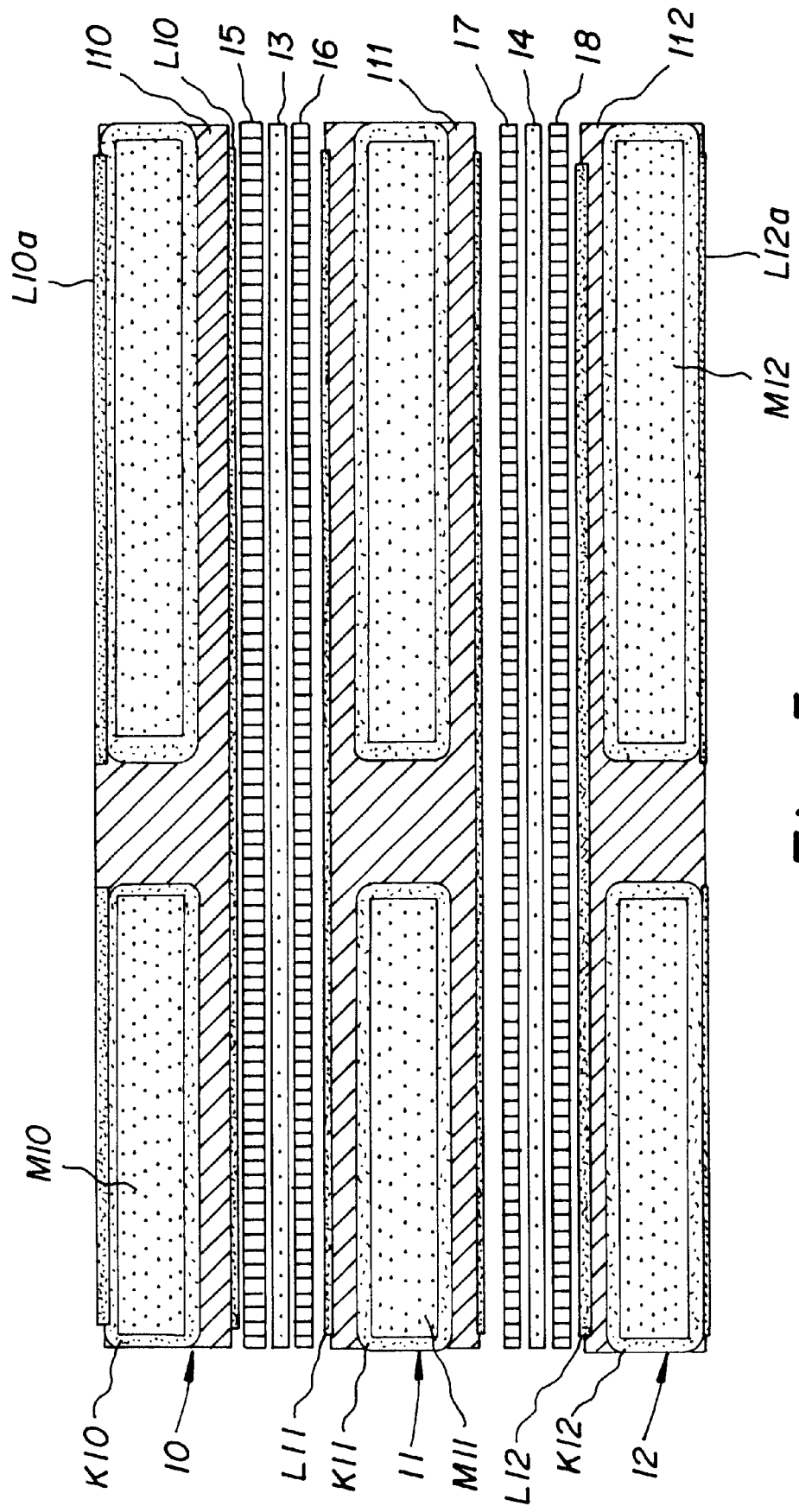
FIGS. 5 and 6 are views corresponding to FIGS. 1 and 2 and FIGS. 3 and 4, but showing a fourth embodiment example of a circuit carrier in accordance with the invention.

In an exploded view of a fourth embodiment of the invention illustrated in FIG. 5., three circuit board layers 10, 11, 12 are shown having a structure which corresponds with the circuit board layers 8 and 9 of FIG. 3 or FIG. 4. In other words, the circuit board layers 10, 11, 12 have metal carriers M10, M11, M12 coated in plastic K10, K11, K12 and they have conductor structures L10, L11, L12 on circuit board insulation I10, I11, I12. In addition, outer conductor structures L10a, L12a for the two outermost layers 10 and 12 are attached directly to the plastic coating K10, K12 of the metal carriers M10, M12.

Optically active layers 13 and 14 of polyimide are each provided between a respective pair of conducting path layers 10, 11 and 11, 12. Each of these layers 13, 14 is embedded in two respective layers 15, 16 and 17, 18 of an electrically conducting polymer.

Figure 6:
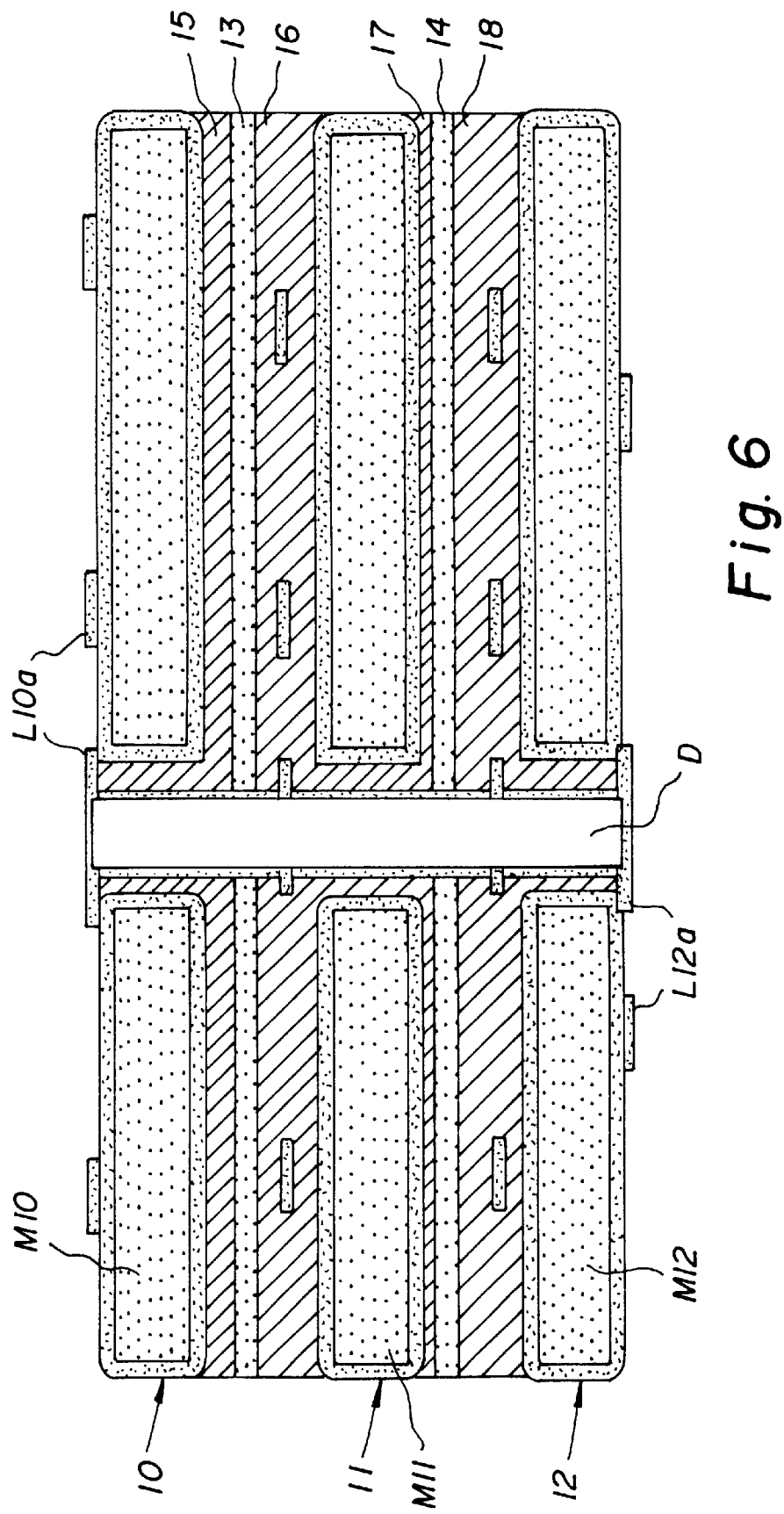

A fourth embodiment of the invention in completely laminated form can be seen in FIG. 6. The FIG. 6 embodiment has a feedthrough D which extends through all of the layers, namely through both of the optical layers 13 and 14 as well. The optic al layers 13 and 14 can be electro-optically influenced through the layers 15, 16 and 17, 18 adjoining them and through appropriate electrical signals, e.g. they may be activated to emit light. In contrast to the semi-finished state illustrated in FIG. 5, FIG. 6 also shows outermost conductor structures L10a and L12a in a finished state.

Figure 7:
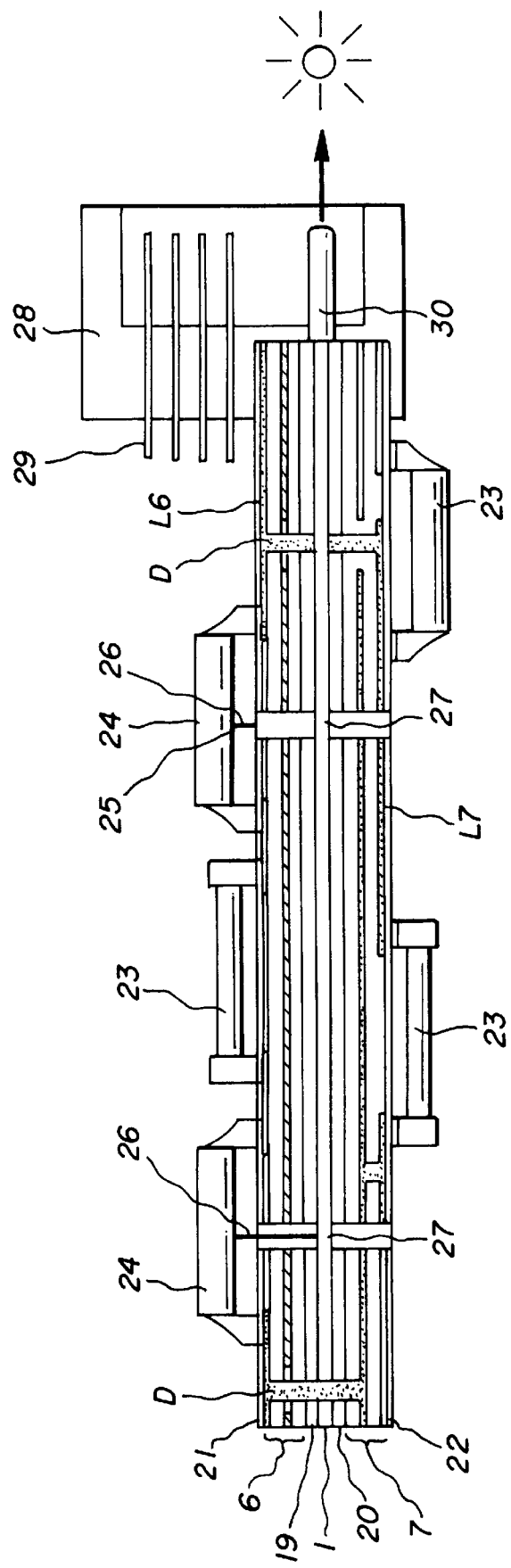
FIG. 7 is a partly sectional, side-elevational view of a circuit carrier in accordance with the invention, with components disposed upon it and with a simplified illustration of a plug-in connection.

A circuit carrier according to the invention in its finished state, equipped with components and provided with a connector, will now be described in detail with reference to FIG. 7. The circuit carrier is formed of two circuit board layers 6 and 7, which can be constructed in the same way as those in FIG. 2 and therefore bear the same reference numerals, together with an optical layer 1. In each case a separating layer 19, 20, which can be formed of a polymer, is located between this optical layer 1 and the circuit board layers 6, 7. The circuit board layers 6, 7 can be given a coating 21, 22 on the outside, e.g. a layer of lacquer. Analogously to FIG. 6, feedthroughs can be provided.

Active and/or passive electronic components 23 are disposed on surfaces of the circuit carrier using known technologies, e.g. in accordance with the SMD or ball grid array technique, and are connected with the conductor structures in the desired manner.

In addition, however, active and/or passive optoelectronic components 24 are mounted. The components 24 have an optical connection 25 at their underside for the entry or exit of light and from which an optical or fiber-optic waveguide 26 leads as far as the optical layer 1. A beam deflection of 90° is effected within the optical layer 1 through the use of a ground angle 27, a prism, a mirror or the like, so that the beam running in the drawing vertically towards or away from the component 24 is deflected to run horizontally within the optical layer 1.

In order to connect with other electronic and/or electro-optical components or devices, a plug-in connector 28 is provided which has electrical and optical contacts 29 and 30 and which forms a hybrid plug-in connection with a non-illustrated suitable mating plug-in component that, e.g. can be fixed to the device. The connection allows the circuit carrier to be placed in its position or replaced by plugging-in or unplugging in the usual way without additional manipulation being necessary.

The optical layer 1, 13, 14 can be constructed as a film or contained within a film with appropriate coatings 17, 18; 19, 20, that are insulating or conducting. The fabrication of the optical layer can, for example, be carried out by hot stamping or visible optical patterning, in particular laser patterning. It is preferably constructed as a multimode waveguide but can also be realized as a single-mode waveguide. Since the dimensions of normal circuit carriers are not very large, attenuation values of, for example, 0.2 dB per centimeter can be accepted within the optical layer, which exerts a favorable influence on the price of the materials being used.

We claim:

1. A circuit carrier, comprising:
    at least one optical layer having two sides;
    other layers including at least one insulating material and electrically conducting structures located at said other layers in which both of said sides of said at least one optical layer are embedded.

2. The circuit carrier according to claim 1, wherein said other layers include at least one electrically conducting layer adjoining at least one of said sides of said at least one optical layer.

3. The circuit carrier according to claim 2, wherein said at least one electrically conducting layer is formed of an electrically conductive polymer.

4. The circuit carrier according to claim 1, wherein said at least one optical layer is an optically active, electrically excitable layer.

5. The circuit carrier according to claim 1, wherein said other layers include at least one circuit board layer having conductor structures and adjoining at least one of said sides of said at least one optical layer.

6. The circuit carrier according to claim 5, wherein said at least one circuit board layer has a metal carrier coated by a layer of plastic.

7. The circuit carrier according to claim 1, including at least one thin layer made of a thermally conducting prepreg and disposed between said at least one optical layer and at least one of said other layers adjoining said at least one optical layer.

8. The circuit carrier according to claim 1, including conductor structures, and feedthroughs passing through said at least one optical layer and connecting said conductor structures to both of said sides of said at least one optical layer.

9. The circuit carrier according to claim 1, wherein said at least one optical layer is a polyimide layer.

10. The circuit carrier according to claim 1, wherein said at least one optical layer is a multimode waveguide.

11. The circuit carrier according to claim 1, including at least one side for surface mounting of SMD components.

12. The circuit carrier according to claim 1, including optoelectronic components mounted at least at one side or surface, and an optical waveguide leading from said optoelectronic components to said at least one optical layer.

13. The circuit carrier according to claim 12, including a ground angle forming an optical connection between said optical waveguide and said at least one optical layer.

14. The circuit carrier according to claim 13, wherein said ground angle is below 90°.

15. The circuit carrier according to claim 1, wherein said at least one optical layer is a film.

16. The circuit carrier according to claim 1, wherein said at least one optical layer is contained in a film.

17. The circuit carrier according to claim 1, wherein said at least one optical layer is fabricated by at least one of hot pressing and visible optical patterning.

18. The circuit carrier according to claim 1, including at least one plug-in connector with electrical and optical contacts for making an electro-optical hybrid plug-in connection with suitable mating contacts.

19. A circuit carrier, comprising:
    at least one optical layer having two sides;
    several other layers of at least one insulating material in which both of said sides of said at least one optical layer are embedded; and
    conductor structures located at said other layers.

* * * * *